United States Patent [19]

Eaton, Jr. et al.

[11] 4,344,156

[45] Aug. 10, 1982

[54] HIGH SPEED DATA TRANSFER FOR A SEMICONDUCTOR MEMORY

[75] Inventors: Sargent S. Eaton, Jr.; David R. Wooten, both of Colorado Springs, Colo.

[73] Assignee: Inmos Corporation, Colorado Springs, Colo.

[21] Appl. No.: 195,729

[22] Filed: Oct. 10, 1980

[51] Int. Cl.³ ............................................ G11C 13/00
[52] U.S. Cl. ........................................ 365/203; 365/189
[58] Field of Search ......................... 365/189, 230, 203

[56] References Cited

U.S. PATENT DOCUMENTS 4,254,477 3/1981 Hsia et al. ........................... 365/200
4,279,023 7/1981 Houghton ............................ 365/203

*Primary Examiner*—Terrell W. Fears

*Attorney, Agent, or Firm*—Donald E. Egan; James M. Wetzel

[57] ABSTRACT

A system is described for use in a semiconductor memory for rapidly transferring data between a plurality of successive memory locations and a data output buss. The system includes a plurality of data latches for storing data derived from successive locations in memory, and a corresponding plurality of serially coupled decoders, each associated with one of the data latches. In response to an address input, one decoder is enabled for causing its associated data latch to output its stored data to the data buss. The latter decoder then disables itself and enables the next decoder so that a second latch outputs its stored data. The process continues with each decoder disabling itself and enabling the next decoder so that the data latches are caused to sequentially output their stored data.

9 Claims, 6 Drawing Figures

FIG. 6

HIGH SPEED DATA TRANSFER FOR A SEMICONDUCTOR MEMORY

BACKGROUND OF THE INVENTION

The invention is directed generally to improvements in semiconductor memories, and particularly to a system for improving the speed with which data is transferred to and from memory locations.

In computer systems and the like, it is frequently desired to rapidly read data stored in a number of successive memory locations. In such circumstances, an individual row and column address is not required for accessing the data in each location. All that is needed is the address of the first memory location and some means for automatically indexing the memory to the following successive locations. Rapid writing of data into successive memory locations may be achieved in the same general manner.

Some conventional memories incorporate a feature referred to as "page mode" operation for rapidly reading the data stored in successive memory locations. In this mode of operation, the data in one row of the memory is latched in a plurality of sense amplifiers. Then successive column addresses are input to the memory to successively output the data stored in each sense amplifier. Because successive row addresses are not required to read the data in each successive location in the accessed row, a two-to-one time savings is achieved in reading data. However, the ratio of a standard read-write cycle time to page mode cycle time (typically a factor of two) is frequently not large enough to warrant the added system complexity required to implement page mode operation. The present invention overcomes this problem by providing a much faster rate of data read and write.

OBJECTS OF THE INVENTION

It is a general object of the invention to provide an improved system for rapidly transferring data to and from successive memory locations in a semiconductor memory.

It is a more specific object of the invention to provide such a system which transfers data more rapidly and with less complexity than conventional page mode systems.

BRIEF DESCRIPTION OF THE FIGURES

The objects stated above and other objects of the invention are set forth more particularly in the following detailed description and in the accompanying drawings, of which.

SUMMARY OF THE INVENTION

The present invention causes data stored in successive locations in a semiconductor memory to be rapidly read out of memory in response to a single address input. To achieve this result, the system includes a plurality of N data latches for storing data associated with N successive memory locations. The latter locations are defined by a plurality of bits of the address input.

To cause the buffers to be sequentially selected for outputting their stored data, a corresponding plurality of N serially connected decoders is included, each decoder being associated with one data latch. In response to the address input, one decoder is enabled for causing its associated data latch to output its stored data. The latter decoder then disables itself and enables the next decoder so that a second latch outputs its stored data. The process continues with each decoder disabling itself and enabling the next decoder so that the data latches are caused to sequentially output their stored data.

In the preferred embodiment, rapid writing of data into memory is effected by including N data buffers. The buffers receive incoming data and are adapted to output that data to N successive memory locations when the memory is in its write mode. Each buffer is controlled by one of the decoders which are sequentially enabled as described above. When enabled, a decoder causes its associated buffer to output its data to memory. Hence, the N buffers are sequentially selected to cause the incoming data to be written into N successive memory locations.

DESCRIPTION OF THE PREFERRED EMBODIMENT

Figure 1:
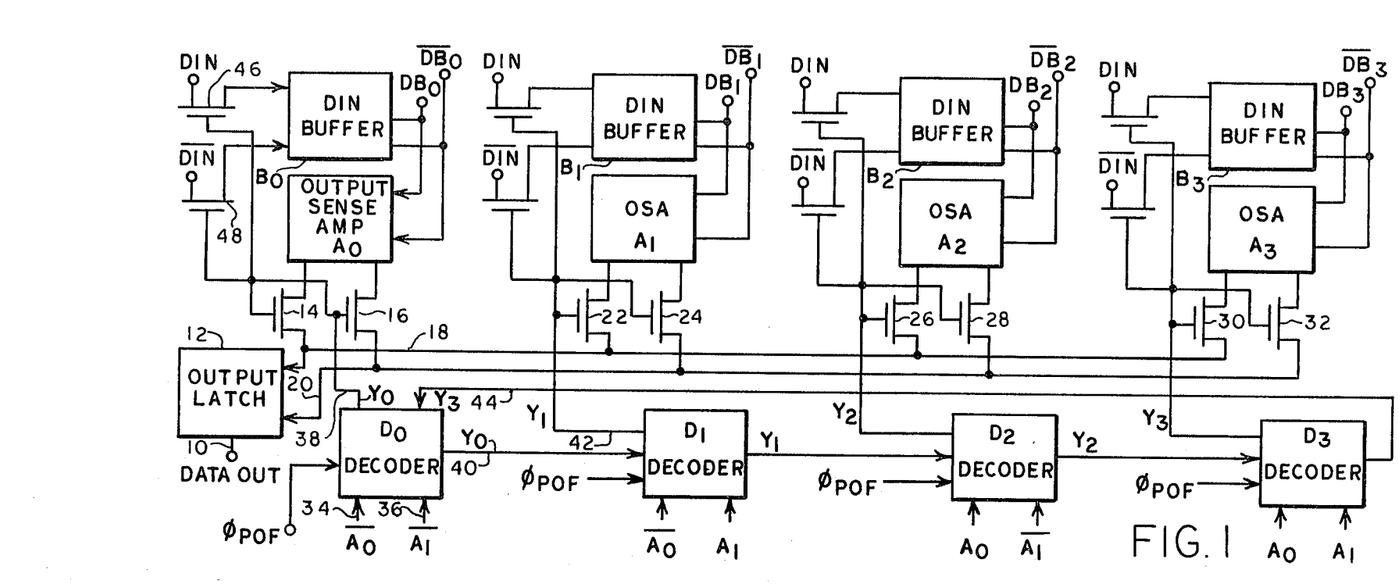
FIG. 1 is a block diagram of a system according to the invention for rapidly transferring data between successive memory locations and a data output buss.

Referring now to FIG. 1, there is shown a system for rapidly reading data from and writing data into successive locations in a semiconductor memory. In the preferred embodiment, "nibble mode" operation is effected whereby four bits of data are read from or written into four successive memory locations in response to a single address input.

The system includes four data latches, shown as output sense amplifiers $A_0$, $A_1$, $A_2$, and $A_3$, and four decoders $D_0$, $D_1$, $D_2$, and $D_3$, each of the latter being associated with one of the sense amplifiers. The sense amplifiers store four bits of data, one bit per sense amplifier, received from four successive memory locations which are identified by six bits of an eight bit address input. Generally, each of the decoders is adapted to be enabled for causing its associated sense amplifier to output stored data to a data buss 10 via an output latch 12. To initiate the output of data, each decoder receives two bits of the address input such that one of the decoders, $D_0$ for example, is enabled in response to the selected two address bits having a given logic state for causing the sense amplifier $A_0$ to output a bit of stored data. Then the enabled decoder disables itself and enables a successive decoder, $D_1$ for example, so that its sense amplifier $A_1$ outputs its stored data. The cycle continues with each decoder disabling itself and enabling the next decoder so that the sense amplifiers are enabled in succession. Thus, four bits of data are output to the data buss 10 in response to a single address input.

As described hereinafter, the decoders $D_0$–$D_3$ are also adapted to be successively enabled for causing four associated data input buffers, $B_0$–$B_3$, to successively apply four bits of input data to four successive locations in memory in response to a single address input. Thus, the illustrated system operates in the "nibble mode" to effect rapid writing of data into memory and rapid reading of data out of memory.

More specifically, the output sense amplifier $A_0$ is adapted to store a data bit and its complement received from a memory location via data busses identified as $DB_0$ and $\overline{DB_0}$. The amplifier $A_1$ is adapted to store a data bit and its complement received from a successive memory location via data busses $DB_1$ and $\overline{DB_1}$. The amplifiers $A_2$ and $A_3$ are likewise adapted to store data bits and their complements received via busses $DB_2$, $\overline{DB_2}$, and $DB_3$, $\overline{DB_3}$, respectively. The data bits carried by the busses $DB_0$–$DB_3$ (and their complements) are received from four successive memory locations which are defined by six bits of an eight bit address input to the memory.

The output of the amplifier $A_0$ is coupled to the drains of MOS transistors 14 and 16, and the sources of the latter transistors are coupled via leads 18 and 20 to the input of the output latch 12. Thus, when the transistors 14 and 16 are turned on, the data stored in the amplifier $A_0$ is coupled to the output buss 10 via the latch 12. In a similar manner, the amplifiers $A_1$–$A_3$ are coupled to the output latch 12 by means of transistors 22, 24, 26, 28, 30, and 32.

The decoder $D_0$ receives two selected bits, $\overline{A_0}$ and $\overline{A_1}$, of the input address via leads 34 and 36. The remaining decoders $D_1$–$D_3$ receive the same address bits, but in different logic combinations, so that only one decoder will be initially selected or enabled. The decoder $D_1$, for example, receives $\overline{A_0}$ and $A_1$, the decoder $D_2$ receives $A_0$ and $\overline{A_1}$ and the decoder $D_3$ receives $A_0$ and $A_1$. Thus, when $A_0$ and $A_1$ are both at a low logic level, the decoder $D_0$ is enabled. Consequently, the decoders $D_1$–$D_3$ are all disabled. However, when the $\overline{A_0}$ and $A_1$ are both at a low logic level, the decoder $D_1$ is enabled and the other decoders are disabled. Suffice it to say that the decoders' input bits will have a given logic state which will enable any one of the decoders $D_0$–$D_3$. The enablement of the remaining decoders is described below.

The decoders $D_0$–$D_3$ also preferably receive a clock signal identified as $\phi_{POF}$. After a decoder has been selected, the signal $\phi_{POF}$ clocks its operation as described below.

Figure 2:
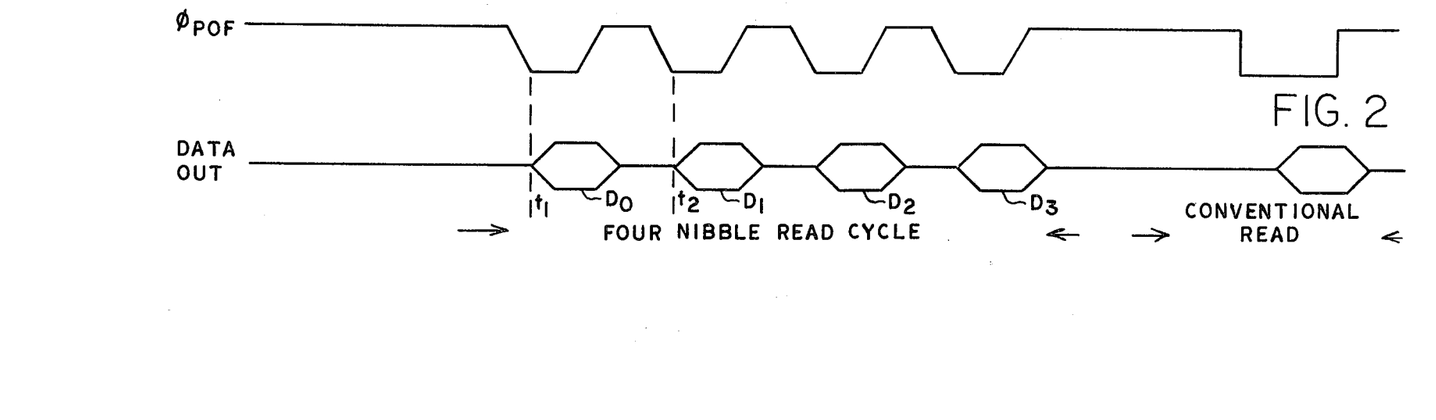
FIG. 2 depicts waveforms useful in describing the system of FIG. 1.

Assuming now that the decoder $D_0$ is selected by each of the bits $\overline{A_0}$ and $\overline{A_1}$ being at a low level, the decoder $D_0$ develops an output signal $Y_0$ when the clock signal $\phi_{POF}$ goes low at time $t_1$, as shown in FIG. 2. The signal $Y_0$ is coupled via a lead 38 to the gates of transistors 14 and 16 for turning them on. Hence, the data stored in the amplifier $A_0$ is coupled via transistors 14 and 16 to the leads 18 and 20, to the output latch 12, and then to the output buss 10. The high or low level data output thus applied to the buss 10 is represented by $D_0$ in FIG. 2.

The decoder $D_0$ then disables itself to turn off the transistors 14 and 16 and couples its output signal $Y_0$ to the next successive decoder $D_1$ via a lead 40. In response to the signal on the lead 40, the decoder $D_1$ is selected so that when the signal $\phi_{POF}$ goes low again at time $t_2$ (FIG. 2), it develops an output signal $Y_1$ on lead 42 for turning on transistors 22 and 24. Hence, output data $D_1$ (FIG. 2) from the amplifier $A_1$ is coupled to the output buss 10. The decoder $D_1$ then disables itself to turn off the transistors 22 and 24 and couples its signal $Y_1$ to the decoder $D_2$ to select the latter for enablement.

The process described above continues so that the decoders $D_2$ AND $D_3$ are successively enabled for causing the output of data $D_2$ and $D_3$ (FIG. 2) in synchronism with the clock pulse $\phi_{POF}$.

After the data has been read out of the amplifier $A_3$, the decoder $D_3$ selects the decoder $D_0$ via a signal $Y_3$ on a lead 44. Hence, each of the decoders may be selected for another cycle of rapid data reading. Alternately, the nibble read cycle described above may be followed by a conventional read cycle as shown in FIG. 2.

It should be understood that the nibble mode cycle may start with whatever decoder is first selected by a pair of low logic level input bits. Thereafter, the other decoders are successively selected until the four sense amplifiers $A_0$–$A_3$ have output their stored data.

To effect a nibble write mode, each of the data input buffers is coupled to associated data busses and receives input data via a pair of transistors which are controlled by one of the decoders. For example, the buffer $B_0$ receives an input data bit DIN and its complement $\overline{DIN}$ via transistors 46 and 48. The output of the buffer $B_0$ is coupled to the data busses $DB_0$ and $\overline{DB_0}$. The buffers $B_1$–$B_3$ are similarly connected to couple input data to their respective data busses. With the memory in a write mode, the decoder $D_0$ may be enabled as described previously for turning on the transistors 46 and 48 for coupling the input data to the busses $DB_0$ and $\overline{DB_0}$. The decoders $D_1$–$D_3$ are then successively enabled as described above for reading three more bits of input data to the remaining busses. In this manner, four bits of input data may be rapidly written into four successive locations in memory.

Figure 3:
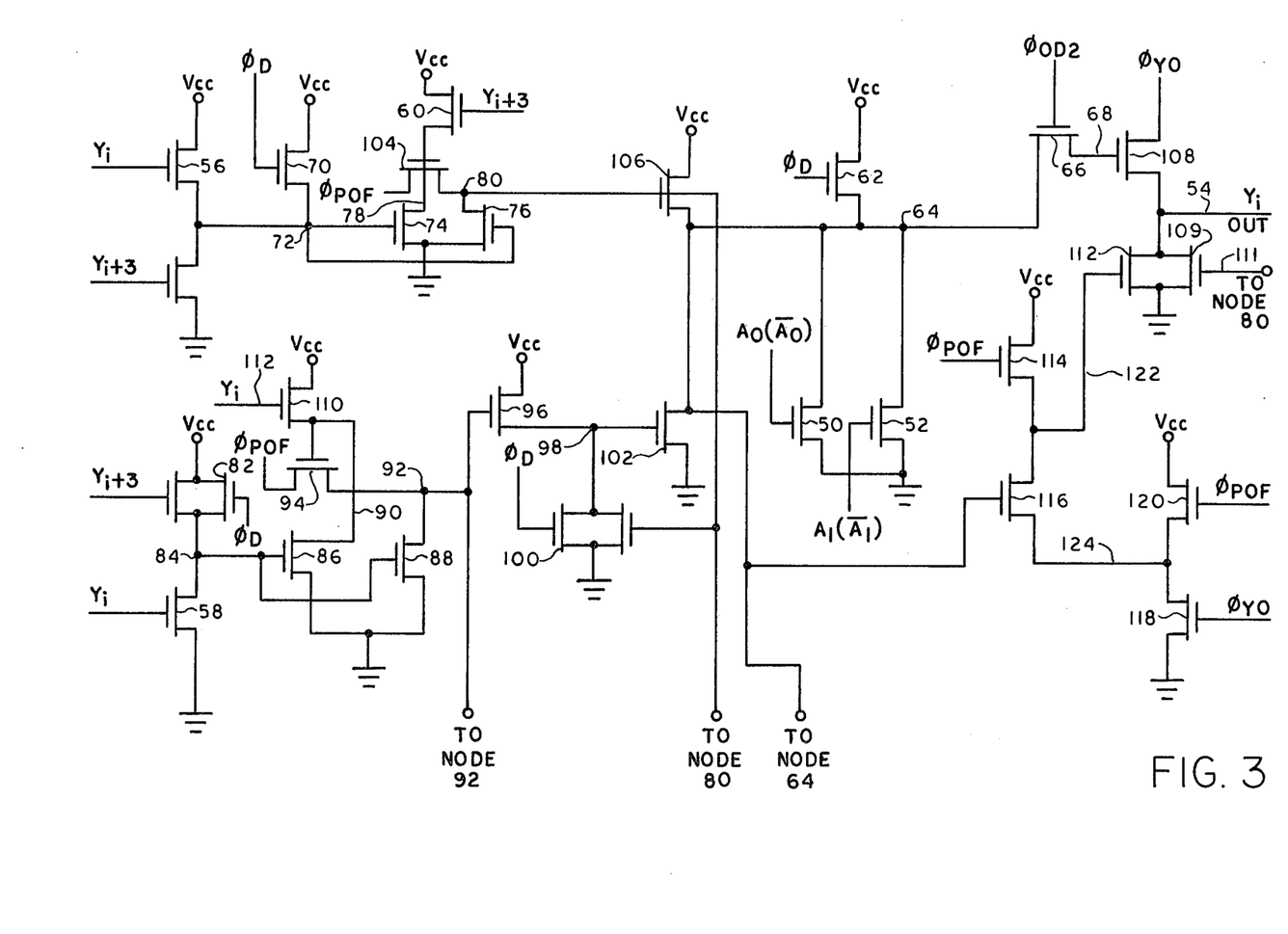
FIG. 3 is a circuit diagram illustrating the preferred construction of each of the decoders of FIG. 1.
Figures 4, 5:
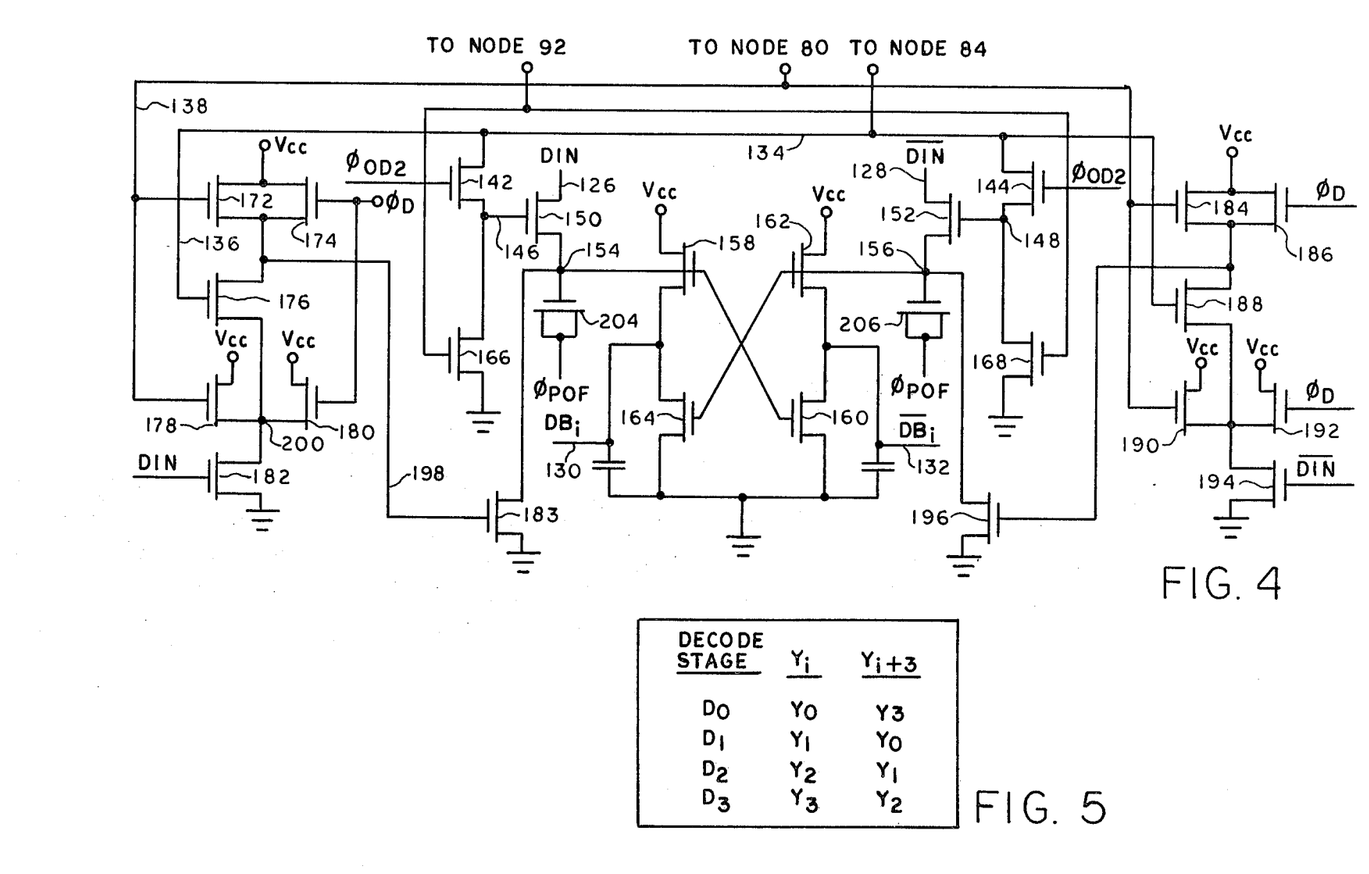
FIG. 4 is a circuit diagram showing the preferred construction of each of the data input buffers of FIG. 1.
FIG. 5 is an index relating the signals generated by the circuitry of FIG. 3 to the various decoders of FIG. 1.
Figure 6:
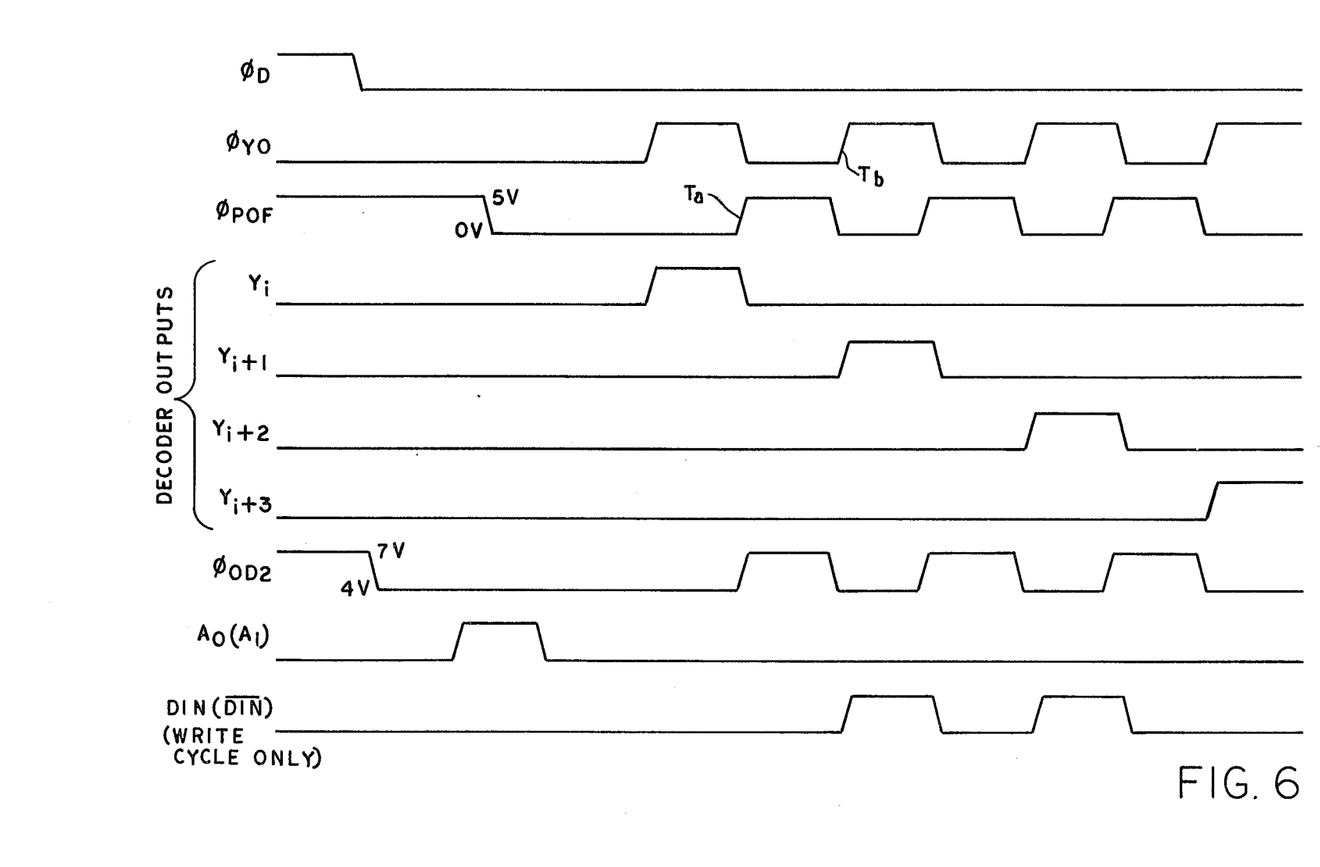
FIG. 6 illustrates the waveforms of various signals associated with the circuitry of FIGS. 3 and 4.

In FIG. 1, the output sense amplifiers $A_0$–$A_3$ and the output latch 12 may be conventional. The decoders $D_0$–$D_3$ are all the same, each being preferably constructed as shown in FIG. 3. The buffers $B_0$–$B_3$ are also of the same construction, one of which is shown in FIG. 4. FIG. 6 depicts waveforms of the various input signals, output signals and clock signals associated with the circuitry of FIGS. 3 and 4.

FIG. 5 is an index which relates the signals developed by the circuitry of FIG. 3 to the various decoders. For example, where the circuitry of FIG. 3 represents the decoder $D_0$, $Y_i$ is the signal $Y_0$ developed by the decoder $D_0$, and $Y_{i+3}$ is the signal $Y_3$ developed by the decoder $D_3$. Where the circuitry of FIG. 3 represents the decoder $D_1$, $Y_i$ represents the signal $Y_1$ developed by the decoder $D_1$ and $Y_{i+3}$ represents the signal $Y_0$ developed by the decoder $Y_0$.

Referring now to FIG. 3, the illustrated decoder receives its address inputs $A_0$ (or $\overline{A_0}$) and $A_1$ (or $\overline{A_1}$) at the gates of transistors 50 and 52. An output lead 54 carries the output signal $Y_i$ developed by the decoder. That output is employed to cause the decoder's associated sense amplifier to output its stored data, and it is also applied to the gates of transistors 56 and 58. In the case where the illustrated decoder represents the decoder $D_0$, the signal $Y_i$ represents the signal $Y_0$ shown in FIG. 1.

A signal identified as $Y_{i+3}$ is applied to the gate of a transistor 60. In the case where the illustrated decoder is $D_0$, the signal $Y_{i+3}$ is the signal $Y_3$ shown in FIG. 1 and corresponds to the $Y_i$ output of the decoder $D_3$.

The illustrated decoder receives a precharge signal $\phi_D$ (see FIG. 6) which is initially high and which is applied to the gate of a transistor 62 for raising its source (node 64) to a high level. Another clock signal $\phi_{OD2}$ (FIG. 6) is also high and is applied to the gate of a transistor 66 which is coupled to the node 64. Hence, the drain of transistor 66 (node 68) is also driven high.

The signal $\phi_D$ is also applied to the gate of a transistor 70 for precharging node 72 to a high level. Consequently, transistors 74 and 76 are turned on for pulling their drain connections (nodes 78 and 80) to a low level.

The gate of another transistor 82 receives $\phi_D$ for raising the voltage at node 84 so as to turn on transistors 86 and 88 and pull their drain connections (nodes 90 and 92) to a low level. A transistor 94 which is coupled to the node 90 via its gate is thus turned off, as is a transistor 96 whose gate is coupled to node 92. The source of the transistor 96 is coupled via a node 98 to a transistor 100 whose gate receives the signal $\phi_D$. Consequently, the latter transistor is turned on to lower the voltage at the node 98. A transistor 102 whose gate is also coupled to the node 98 is therefore turned off. The drain of the latter transistor is coupled to the node 64 but, since the latter transistor is now off, it does not disturb the high level to which the node 64 is precharged.

The signal $\phi_{POF}$ (see FIGS. 1 and 6) is high at this time and is applied to a transistor 104 whose gate is coupled to the node 78 and whose source is coupled to the node 80. Because the node 78 is at a low level, the transistors 104 is held off and the node 80 remains at a low level. The node 80 is also coupled to the gate of another transistor 106 which is also held off at this time.

The signal $\phi_{POF}$ is also applied to the transistor 94. Because the gate of the transistor 94 is coupled to the low level on node 90, the transistor 94 remains off and the potential at its source (node 92) remains low.

Assuming now that the address inputs $A_0$, $A_1$ to the transistors 50 and 52 are low, both the latter transistors remain off. Consequently, the node 64 remains at a high level as does the node 68. The latter node is coupled to the gate of a transistor 108 whose drain receives the signal $\phi_{Y0}$. Because $\phi_{Y0}$ is high (see FIG. 6), the transistor 108 develops a high level output $Y_i$ at the lead 54.

The lead 54 is also coupled to the drain of a transistor 109 whose gate lead 111 is coupled (via a connection which is not shown) to the node 80. It will be recalled that the node 80 was pulled low during the precharge cycle. Hence, the transistor 109 is held off to permit the signal $Y_i$ at lead 54 to go high. Thus, in the case where the illustrated decoder represents the decoder $D_0$ (FIG. 1), $Y_i$ represents $Y_0$ and the transistors 14 and 16 (FIG. 1) are turned on. All the other decoders are off because at least one of their address inputs is high. Consequently, at least one of the transistors which corresponds to transistors 50 and 52 in the other decoders is turned on for pulling low the voltage at nodes corresponding to nodes 64 and 68, thereby inhibiting $\phi_{Y0}$ from driving $Y_i$ high in the other decoders.

As stated previously, each of the decoders is adapted to disable itself after its associated sense amplifier has output its stored data. For this purpose, the signal $Y_i$ at lead 54 is coupled to the gate of a transistor 110 via a lead 112 and also to the gate of transistor 58. Consequently, node 84 is pulled low to turn off transistors 86 and 88. In addition, transistor 110 is turned on to raise the potential at node 90 for turning on the transistor 94. When $\phi_{POF}$ goes high again at time $T_a$ (FIG. 6), that high level is coupled to the node 92 by the transistor 94. Consequently, transistor 96 turns on to drive the node 98 high, and transistor 102 turns on for pulling node 64 low. Hence, the decoder is disabled so that the next time the signal $\phi_{Y0}$ goes high, the output $Y_i$ will not be driven high.

Referring briefly to FIG. 6, it can be seen that, when $\phi_{POF}$ goes high at time $T_a$, $\phi_{Y0}$ goes low. The latter signal going low causes the output $Y_i$ at lead 54 to go low also.

Assuming that the operation described above relates to the decoder $D_0$, the latter decoder will enable the decoder $D_1$ for activation by the next high level pulse from $\phi_{POF}$. To explain this phase of the operation, it will now be assumed that the circuitry shown in FIG. 3 represents the decoder $D_1$ (all the decoders are constructed as shown in FIG. 3). Thus, the $Y_{i+3}$ input to the decoder $D_1$ represents the $Y_i$ output of the decoder $D_0$.

When the $Y_i$ output of the decoder $D_0$ went high, the $Y_{i+3}$ input to the decoder $D_1$ was driven high at the gate of the transistor 60. Hence, the node 78 was driven high and turned the transistor 104 on. When $\phi_{POF}$ went high at time $T_a$, the transistor 104 pulled the node 80 high and turned on transistor 106. Because the source of the transistor 106 is coupled to the node 64, the latter node was driven high. $\phi_{OD2}$ also went high at time $T_a$. Hence, the node 68 was also pulled high. But because $\phi_{Y0}$ went low then, the transistor 108 held the $Y_i$ output of the decoder $D_1$ at a low level. However, when $\phi_{Y0}$ goes high at time $t_b$ (FIG. 6), the $Y_i$ output at lead 54 is pulled high.

The operation described above continues for each nibble cycle so that the ith decoder primes the ith plus 1 decoder to fire when $\phi_{Y0}$ goes high.

Each decoder also includes an active hold off circuit coupled to the $Y_i$ output lead 54. This circuit includes transistors 112, 114, 116, 118, and 120 which are arranged to actively hold the $Y_i$ output of the unselected decoders at a low level.

The gates of transistors 114 and 120 each receive the $\phi_{POF}$ signal, wherefore their sources (nodes 122 and 124) are pulled to a high level during the precharge cycle. The gate of transistor 118 receives the $\phi_{Y0}$ signal so that, when that signal goes high, the drain of transistor 118 (node 124) is pulled low.

If node 64 is low (indicating that the decoder is not selected), the transistor 116 remains off and the node 122 remains high. Consequently, the transistor 112 is turned on to hold the lead 54 at ground potential.

In the case in which the node 64 is high, the transistor 116 is turned on to pull node 122 low and hold the transistor 112 off to permit the lead 54 to be driven to a high level.

Referring now to FIG. 4, a data input buffer is shown whose construction is preferably of the type used for each of the buffers $B_0$–$B_3$ of FIG. 1. The illustrated buffer includes input leads 126 and 128 for receiving externally applied DIN and $\overline{DIN}$ data inputs and outputs leads 130 and 132 which coupled $DB_i$ and $\overline{DB}_i$ outputs to the data busses (such as $DB_0$ and $\overline{DB_0}$) of FIG. 1. Other inputs include leads 134 and 136 which couple to node 64 of FIG. 3, lead 138 which couples to node 80 of FIG. 3, and lead 140 which couples to node 92 of FIG. 3. As described in detail below, an enabled decorder activates its associated buffer to cause the latter to couple the data input (DIN and $\overline{DIN}$) to the $DB_i$ and $\overline{DB}_i$ outputs.

When the decoder which is associated with the illustrated buffer is not enabled, the potential at the decoder's node 64 is low. That low level potential is couped via the lead 134 to transistors 142 and 144 whose gates receive the signal $\phi_{OD2}$. Consequently, the sources (nodes 146 and 148) of transistors 142 and 144 are at a low level.

Nodes 146 and 148 are directly connected to the gates of transistors 150 and 152 which receive the DIN and $\overline{\text{DIN}}$ inputs. With nodes 146 and 148 at a low level, these transistors remain off to decouple the DIN and $\overline{\text{DIN}}$ inputs from the output leads 130 and 132.

When the decoder which is associated with the illustrated buffer is enabled, the potential at the decoder's node 64 is high. Consequently, buffer nodes 146 and 148 are both high and transistors 150 and 152 are turned on. In the case where the DIN input is high and the $\overline{\text{DIN}}$ input is low, the sources of transistors 150 and 152 (nodes 154 and 156) are driven high and low, respectively.

The node 154 is coupled to the gates of transistors 158 and 160, while the node 156 is coupled to the gates of transistors 162 and 164. Consequently, transistors 162 and 164 are turned off and transistors 158 and 160 are turned on. Hence, the lead 130 is driven to a high level and the lead 132 is driven to a low level. The data coupled to leads 130 and 132 is thus written into a selected memory location via one of the data buss pairs of FIG. 1.

It will be appreciated that writing data into memory is a relatively time consuming operation. Therefore, the data output from the illustrated buffer is held available for reading even after the next successive decoder and buffer are enabled on the next nibble cycle. Toward this end, transistors 166 and 168 are included to trap the logic levels on nodes 154 and 156, so that the logic levels imposed on output leads 130 and 132 remain unchanged for the next three nibble cycles.

The gates of transistors 166 and 168 are coupled via the lead 140 to node 92 in FIG. 3. The latter node is driven to a high level when $\phi_{POF}$ goes high at the beginning of a nibble cycle. Consequently, transistors 166 and 168 are turned on. Because their drains are coupled to the gates of transistors 150 and 152, the latter transistors are turned off. Thus, the high and low levels previously applied to nodes 154 and 156 are trapped there. Hence, transistors 158 and 160 are held on while transistors 162 and 164 are held off. The high and low levels appearing on leads 130 and 132, respectively, are thus maintained. Hence, the write cycle time is shortened because writing can overlap into three succeeding cycles.

The illustrated buffer also preferably includes a pair of active hold off circuits to hold the buffer insensitive to further data inputs when its associated decoder is disabled. The first hold off circuit includes transistors 172, 174, 176, 178, 180, 182, 183. The other includes transistors 184, 186, 188, 190, 192, 194, and 196.

Referring to the first hold off circuit, the gates of transistors 174 and 180 receive the signal $\phi_D$ for precharging nodes 198 and 200 to a high level. The $\overline{\text{DIN}}$ input is coupled via a lead 202 to the gate of transistor 182 so that, when $\overline{\text{DIN}}$ is high, node 200 is pulled low.

The gate of transistor 176 is coupled via lead 136 to node 64 in FIG. 3, its source is coupled to node 200, and its drain is coupled to node 198. Thus, if the buffer's decoder is enabled, node 64 is high, transistor 176 is on, and node 198 is pulled low. Hence, transistor 183 is turned off and the potential at its drain (node 154) is allowed to vary in response to the $\overline{\text{DIN}}$ input at lead 126.

If the illustrated buffer's decoder had been disabled, node 64 in that decoder would be low, wherefore transistor 176 would be off and node 198 would be at a high level. Consequently, transistor 183 would be on to pull the node 154 to ground potential.

The other hold off circuit operates in a manner similar to that described above. Suffice it to say that when the buffer's decoder is enabled, the transistor 196 remains off to allow node 156 to vary in response to the $\overline{\text{DIN}}$ input at lead 128. Otherwise, transistor 196 is on to hold node 156 at ground potential.

It is often desirable to write a full Vcc voltage into memory locations. In the present embodiment, nodes 154 and 156 are boosted above Vcc to accomplish this, partly by driving DIN and $\overline{\text{DIN}}$ to 1.4 times Vcc and partly by including capacitors 204 and 206 which are coupled to nodes 154 and 156, respectively, and which receive $\phi_{POF}$. With this arrangement, the potentials at nodes 154 and 156 are driven even higher when $\phi_{POF}$ rises.

Another feature which improves the speed of the system is the use of $\phi_{OD2}$. As shown in FIG. 6, $\phi_{OD2}$ generally follows $\phi_{POF}$, but $\phi_{OD2}$ varies between 7 volts and 4 volts whereas $\phi_{POF}$ varies between 5 volts and zero volts. The use of $\phi_{OD2}$ considerably shortens the precharge portion of the nibble cycle as demonstrated by the comments below.

It will be understood that it is desirable to drive the signal $Y_i$ (at lead 54) up to Vcc (five volts, for example). To do this, the voltage at lead 68 is driven higher than Vcc, preferably toward seven volts, in the following manner. Referring to FIG. 6, it can be seen that $\phi_{OD2}$ drops from seven volts to four volts just prior to $\phi_{YO}$ going high at time $t_b$. Just prior to that occurrence, $\phi_{POF}$ had been high to precharge node 64 to about four volts via transistors 104 and 106. Hence, the transistor 66 has four volts at its gate and about four volts at its source. In this state, the transistor 66 is cut off, thereby releasing or isolating node 68 from node 64. Accordingly, when $\phi_{YO}$ goes high to raise the voltage at the drain of transistor 108, node 68 is bootstrapped to about seven volts by the gate-to-drain capacity of the transistor and $Y_i$ is driven high. Had transistor 66 not been cut off by $\phi_{OD2}$, node 68 would not have been released from the node 64, no such bootstrapping would have occurred, and the signal $Y_i$ would not have been driven to as high a level as is desired.

It will be appreciated that the transistor 66 could have been cut off by causing node 64 to be precharged to a higher level. However, the additional time required for such precharging to occur would lengthen the time required to enable the decoder. With the illustrated arrangement, the decoder's enabling time is kept short while still retaining the ability to bootstrap the node 68 and drive the signal $Y_i$ up to Vcc.

An arrangement utilizing $\phi_{OD2}$ in a similar manner is shown in FIG. 4 in which buffer nodes 146 and 148 are quickly released from node 64 when $\phi_{OD2}$ falls to four volts, thereby permitting efficient bootstrapping to occur at nodes 146 and 148.

The present system may be used with a pair of memories, each of which operate in the nibble mode. Conventionally, each such memory is controlled by $\overline{\text{RAS}}$ and $\overline{\text{CAS}}$ clocks to define the precharge and active (read or write) cycles. A first memory may have $\overline{\text{RAS}}$ and $\overline{\text{CAS}}$ going low to initiate a nibble read (or write) cycle while a second memory is in a precharge mode. Then the $\overline{\text{RAS}}$ and $\overline{\text{CAS}}$ clocks in the first memory may be driven high to precharge the first memory while $\overline{\text{RAS}}$ and $\overline{\text{CAS}}$ in the second memory go low to initiate a nibble read cycle therein. By so staggering the $\overline{\text{RAS}}$ and $\overline{\text{CAS}}$ clocks for both memories, a bit of data may be read for each nibble cycle for an indefinite period of time.

One of the advantages of the illustrated decoder and buffer is that virtually no D.C. power is consumed and reliable operation is obtained at low precharge voltages. Of course, very high speed operation is obtained by virtue of each decoder disabling itself and enabling a successive decoder. In addition, input data is easily and rapidly read by virtue of the fact that each buffer maintains the status of its data outputs through four nibble cycles.

Although the invention has been described in terms of a preferred embodiment, it will be obvious to those skilled in the art that many modifications and alterations may be made without departing from the invention. Accordingly, it is intended that all such modifications and alterations be considered as within the spirit and scope of the invention as defined by the appended claims.

What is claimed is:

1. In a semiconductor memory, a system for rapidly transferring data between a plurality of successive memory locations and a data output buss in response to a single address input, comprising:
   a plurality of N data latches for storing data associated with N successive memory locations which are defined by a plurality of bits of the address input;
   a corresponding plurality of N serially connected decoders each associated with one of said data latches, each adapted to be enabled for causing its associated data latch to output its stored data to the data buss, and each receiving selected bits of the address input such that one of the decoders is initially enabled, in response to said selected bits having a given logic state, for causing its associated data latch to output its stored data to the data buss, the enabled decoder being adapted to then disable itself and to enable a successive decoder, the latter decoder and each remaining decoder being adapted to disable itself after having been enabled and to enable a successive decoder so as to cause the data latches to output, to the data buss, N successive bits of data in response to a single address input.

2. A system as set forth in claim 1 including a plurality of input buffers for writing input data into memory locations, wherein each of said decoders is associated with an input buffer, and wherein said decoders are responsive to a single address input for selecting said buffers sequentially so as to write the input data into successive memory locations.

3. A system as set forth in claim 2 wherein each buffer includes an input for receiving data, an output for coupling data to memory, and means for holding the data at its output while successive buffers are selected such that writing of the data at a buffer output may continue while successive buffers are selected.

4. A system as set forth in claim 3 wherein each buffer includes a hold-off circuit for rendering the buffer insensitive to data received at its input while its associated decoder is disabled.

5. A system as set forth in claim 1 wherein each decoder includes:
   an address-input circuit receiving the selected address bits for developing an output signal in response to the selected address bits being in a given logic state;
   means for coupling said output signal to an associated data latch for causing said data latch to output its stored data; and
   a disabling circuit coupled to said address-input circuit, receiving the latter circuit's output signal and a clock signal, and being responsive to said control signal and to the clock signal for inhibiting the address-input circuit from developing a further output signal, whereby each decoder disables itself after having been enabled.

6. A system as set forth in claim 5 wherein each decoder further includes:
   an enabling circuit coupled to said address-input circuit, receiving the output signal of a previous decoder and said clock signal, and responsive to the previous decoder's output signal and the occurrence of said clock signal for enabling its address-input circuit to develop an output signal, whereby each decoder is enabled by a previously enabled decoder.

7. A system as set forth in claim 5 wherein said address-input circuit includes:
   a first node adapted to be precharged to a positive voltage level;
   transistor means receiving the address input bits for inhibiting the discharge of said first node in response to said address bits being in said given logic state;
   a first transistor having a source coupled to said first node, having a gate receiving a second clock signal, and having a drain coupled to a second node;
   a second transistor having a gate coupled to the second node, having a drain receiving a third clock signal, and a source output terminal for developing the control signal thereat,
   said second clock signal being selected to go high to turn on the first transistor and precharge said second node, and then to go low so as to substantially cut off said first transistor and thereby isolate said first node from said second node,
   said second clock signal being selected to go high while said first transistor is substantially cut off, to bootstrap said second node to a higher voltage via gate-to-drain capacitance associated with said second transistor and to drive the output terminal to a relatively high positive voltage.

8. In a semiconductor memory having a read mode and a write mode, a system for rapidly writing incoming data into four successive memory locations and for reading data out of four successive memory locations, comprising:
   four data latches for storing data associated with four successive memory locations which are defined by a plurality of bits of the address input, each data latch being adapted to output its stored data when selected by an enabled decoder;
   four data input buffers each having an input for receiving incoming data, an output for coupling the data to memory, and each being adapted to output the data to memory when selected by an enabled decoder;
   four serially connected decoders, each associated with one of said data latches and with one of said input buffers, and each receiving selected bits of the address input such that one of the decoders is initially enabled in response to the address input for selecting its associated data latch when the memory is in a read mode and for selecting its associated input buffer when the memory is in a write mode, the enabled decoder being adapted to disable itself and enable a successive decoder, the latter decoder and each remaining decoder being adapted to disable itself after having been enabled and to enable a successive decoder so as to rapidly write four bits of data into successive memory locations when the memory is in the write mode and to rapidly read four bits of data out of successive memory locations when the memory is in the read mode.

9. A system as set forth in claim 8 wherein each input buffer includes means for holding data at its output while successive input buffers are selected so that its data can continue to be read into memory after its associated decoder has been disabled.

* * * * *